(12) United States Patent
Kierey et al.

(10) Patent No.: US 8,342,701 B2
(45) Date of Patent: Jan. 1, 2013

(54) REFLECTIVE OPTICAL ELEMENT FOR USE IN AN EUV SYSTEM

(75) Inventors: Holger Kierey, Aalen (DE); Michel Le Maire, Oberkochen (DE); Willi Anderl, Huettlingen (DE); Hubert Holderer, Oberkochen (DE); Anton Lengel, Oberkochen (DE)

(73) Assignee: Carl Zeiss Laser Optics GmbH, Oberkochen (DE)

( * ) Notice: Subject to any disclaimer, the term of this patent is extended or adjusted under 35 U.S.C. 154(b) by 247 days.

(21) Appl. No.: 12/851,187

(22) Filed: Aug. 5, 2010

(65) Prior Publication Data

US 2011/0051267 A1 Mar. 3, 2011

Related U.S. Application Data

(60) Provisional application No. 61/238,364, filed on Aug. 31, 2009.

(30) Foreign Application Priority Data

Aug. 31, 2009 (DE) .................. 10 2009 039 400

(51) Int. Cl.
*G02B 5/08* (2006.01)
(52) U.S. Cl. ....................................... 359/845
(58) Field of Classification Search .......... 359/845, 359/838
See application file for complete search history.

(56) References Cited

U.S. PATENT DOCUMENTS

| 2004/0051984 A1 | 3/2004 | Oshino et al. |
| 2004/0165296 A1 | 8/2004 | Schaefer |
| 2005/0099611 A1* | 5/2005 | Sogard .................. 359/845 |
| 2006/0227826 A1 | 10/2006 | Balogh et al. |
| 2007/0091485 A1 | 4/2007 | Phillips et al. |
| 2008/0043321 A1 | 2/2008 | Bowering et al. |
| 2009/0147386 A1 | 6/2009 | Sogard et al. |
| 2009/0174934 A1 | 7/2009 | Boehm |

FOREIGN PATENT DOCUMENTS

| DE | 10 2005 017 2 | 10/2006 |
| DE | 10 2005 026 4 | 12/2006 |
| DE | 10 2007 052 8 | 5/2008 |
| DE | 10 2008 054 8 | 7/2009 |

OTHER PUBLICATIONS

German Examination Report, with English translation, for corresponding DE Appl No. 10 2009 039 400.1, dated Dec. 17, 2009.

* cited by examiner

*Primary Examiner* — Euncha Cherry
(74) *Attorney, Agent, or Firm* — Fish & Richardson P.C.

(57) ABSTRACT

A reflective optical element for use in an EUV system is disclosed. The reflective optical element includes a base body, which is produced at least partly from a substrate material. At least one cooling channel through which a cooling medium can flow is arranged in the base body. A material having a thermal conductivity of greater than 50 W/mK is provided as substrate material. The reflective optical element also includes a polishing layer, which is applied on the substrate material. The polishing layer includes an amorphous material which can be processed via polishing.

25 Claims, 2 Drawing Sheets

REFLECTIVE OPTICAL ELEMENT FOR USE IN AN EUV SYSTEM

CROSS-REFERENCE TO RELATED APPLICATIONS

This application claims priority under 35 U.S.C. §119(e)(1) to U.S. Provisional Application No. 61/238,364 filed Aug. 31, 2009. This applications also claims priority under 35 U.S.C. §119 to German Patent Application DE 10 2009 039 400.1, filed Aug. 31, 2009. The contents of both of these applications are hereby incorporated by reference in its entirety.

FIELD

The disclosure relates to a reflective optical element for use in an EUV lithography system including a base body, which is produced at least partly from a substrate material. At least one cooling channel through which a cooling medium can flow is arranged in the base body.

BACKGROUND

For optical applications in the extreme ultraviolet wavelength range (EUV) particularly in lithography, almost exclusively reflective optical elements are usually used, the surfaces of which desirably satisfy stringent desired properties with regard to figure and roughness. It is known from to produce such reflective optical elements from glass, for example quartz, or from glass ceramic, for example Zerodur or ULE. The surfaces of these elements are usually polished via so-called superpolishing until a microroughness of the surface is less than 0.2 nm rms.

However, these substrate materials are often suitable only to a limited extent for operation with very high thermal loads which can occur at high radiation powers. This can be all the more applicable if the optical element is configured in the form of a gathering collector mirror for an EUV radiation source. In this case, in general, the high radiation power not only has to be emitted in the EUV wavelength range, but can also result from radiation of the EUV source outside the EUV wavelength range. In these cases, a thermal conductivity of the known mirror materials is often too low to conduct away enough heat from the reflective surface, which can lead to severe heating of the mirror and to a functional disturbance as a result of bending and as a result of thermal degradation of a reflection layer of the mirror.

US 2004/051984 A1 discloses, for the purpose of improving cooling of a reflective optical element, applying a cooling medium to a surface. Stress-dictated distortions of the mirror surface are intended to be substantially reduced by this approach. In such an approach, the cooling capacity can be restricted.

US 2007/0091485 discloses a reflective optical element in the form of a mirror for use in an EUV system. The mirror includes a base body divided into two, which is produced from silicon, Zerodur, copper or Invar and which includes an upper part and a lower part. For the purpose of cooling the mirror, cooling channels are arranged in the upper part of the base body, the cooling channels being configured as so-called microchannels having a diameter of 100 μm or less. In this case, the microchannels are designed such that a laminar flow is established in the channels. This system can be complex and expensive to produce.

US 2008/0043321 A1 discloses a further reflective optical element, which is composed of a plurality of mirror segments and can be used in an EUV lithography system. US 2008/0043321 discloses a multiplicity of substrate materials from which the mirror segment can be constructed. A so-called smoothing layer and a reflection layer are applied on the mirror segment. The mirror segments are connected via bonding to form a mirror.

US 2009/0147386 A1 discloses a mirror for EUV applications which includes a base body, on which a reflective surface is arranged. The mirror furthermore includes a heat dissipation device, which is arranged on a rear side of the base body at a distance from the base body. The heat dissipation device and the base body are connected to one another via bending elements. Cooling channels through which a cooling liquid can be passed are arranged in the heat dissipation device. With the aid of the circulating cooling liquid in the cooling channels, the intention is to obtain a defined temperature distribution in the heat dissipation device.

SUMMARY

The disclosure provides a reflective optical element which is suitable for use in the EUV wavelength range under high thermal loads, has an optically high-quality surface and is furthermore distinguished by simple and cost-effective producibility. The disclosure also provides a method for producing such a reflective optical element.

According to the disclosure, a material having a thermal conductivity of greater than 50 W/(mK) is provided as substrate material for the reflective optical element, and the reflective optical element also includes a polishing layer, which is applied on the substrate material and which includes an amorphous material which can be processed via polishing, for example superpolishing. The substrate material can, in particular, also have a thermal conductivity of greater than 120 W/mK or greater than 160 W/mK. A material having a comparatively high thermal conductivity is thus used in the base body, as a result of which dissipation of the heat from a surface of the optical element to the cooling medium in the cooling channels is significantly improved. By virtue of the additionally applied polishing layer, a significantly improved surface quality can be obtained via superpolishing.

In some embodiments, the material provided as substrate material has a modulus of elasticity of more than 60 GPa. For example, a material having a modulus of elasticity of greater than 200 GPa or greater than 250 GPa can be used. The material is thus distinguished by a comparatively high stiffness, such that it is also possible, in particular, to configure larger cooling channels in the base body and/or to increase a natural frequency of the base body.

In certain embodiments, the material provided as substrate material has a density of at most 3.5 g/cm$^3$. In particular, it is possible to provide a material having a density of at most 2.7 g/cm$^3$. A low density of the material leads to a higher natural frequency of the body, such that the oscillation properties of an optical element produced from such a material are improved.

In some embodiments, a metallic substrate, such as aluminum and/or an aluminum alloy, is provided as substrate material. An inexpensive material having the desired physical properties is thus provided.

In certain embodiments, a ceramic substrate, such as silicon carbide SiC and/or Si-infiltrated silicon carbide SiSiC and/or silicon nitrite and/or polysilicon, is provided as substrate material. These materials are distinguished by a particularly low thermal expansion, a good thermal conductivity, a very high modulus of elasticity and a low density and are therefore very well suited to an optical element according to the disclosure.

In some embodiments, a metal composite substrate, which can be configured, in particular, as a silicon carbide dispersion strengthened aluminum, is provided as substrate material. These materials are distinguished by a low thermal expansion, a good thermal conductivity, a high modulus of elasticity and a low density and are therefore very well suited to an optical element according to the disclosure.

In certain embodiments, the amorphous material of the polishing layer includes amorphous silicon Si, amorphous silicon monoxide SiO, amorphous silicon dioxide $SiO_2$ or nickel Ni. These materials are particularly well suited to use with the substrate materials according to the disclosure for the base body.

In some embodiments, the element includes a reflection layer, which is applied on the polishing layer and can be formed by layers composed of molybdenum and silicon or composed of ruthenium and silicon. The polishing layer improves reflection of the incident radiation in a used wavelength range of the optical element.

In certain embodiments, one cooling channel or a plurality of cooling channels or all cooling channels have a cross-sectional area of greater than 0.5 $mm^2$, such as between 40 and 100 $mm^2$. As a result, it is possible to maintain a substantially turbulent flow of the cooling medium in the cooling channels, as a result of which a heat transfer from the base body to the cooling medium is improved.

In some embodiments, sections of one cooling channel or sections of a plurality of cooling channels are arranged parallel to one another or spirally or meanderingly or in a radial direction in the base body. It is advantageous, in particular, to adapt the orientation of the cooling channels to a production method for the base body. Furthermore, a temperature distribution in the optical element, and in particular at a surface of the optical element, can be influenced by the choice of a suitable form of the cooling channels.

In certain embodiments, at least one section of a cooling channel is configured in such a way that a turbulent flow of a cooling medium can be produced in the section. Turbulences can be produced for example by an arrangement of disturbance elements in the cooling channel or by provision of direction changes, bends or other discontinuities in the course of the cooling channel. It is also possible, however, for the turbulences of the cooling medium to be produced by a suitable configuration of a cooling circuit before the cooling medium actually enters into the optical element.

The disclosure provides a method according to the disclosure for producing a reflective optical element for use in an EUV system, which includes:
a) producing a base body composed of a substrate material having a thermal conductivity of greater than 50 W/mK, at least one cooling channel being formed in the base body,
b) shaping a surface of the base body in such a way that a desired surface form of the optical element is approximated,
c) applying a polishing layer composed of an amorphous material to the surface of the base body, and
d) processing the polishing layer for further approximation to the desired surface form of the optical element.

The method provides, in a simple manner, a reflective optical element which is distinguished by a precisely configured surface form in conjunction with low production costs and which is suitable, on account of the improved heat dissipation, for use in an EUV system with high thermal loads. In this method, steps a) and b) can also be combined to form one work step, in which the surface of the base body is already produced in the course of the producing process without further mechanical re-work. Shaping the surface of the base body via a corresponding design of a casting mold shall be mentioned as an example of this.

In some embodiments, in step b), the surface is shaped to a surface accuracy of at most 25 μm and/or to a roughness of at most Ra=1 μm. A surface accuracy of at most 25 μm in this case means that the absolute value of a deviation from a desired surface at any point of the surface is 25 μm or less. In the same way, a roughness of at most Ra=1 μm means that the roughness over the surface is 1 μm or less. The surface is thus leveled relatively coarsely in a cost-saving manner in step b) and the final configuration of the surface is effected by applying and processing polishing layer and reflection layer.

In certain embodiments, a reflection layer is applied to the polishing layer in a subsequent step. The polishing layer improves reflection of the incident radiation in a used wavelength range of the optical element.

BRIEF DESCRIPTION OF THE DRAWINGS

Exemplary embodiments of the disclosure are explained in greater detail below with reference to drawings, in which.

DETAILED DESCRIPTION

Figure 1:
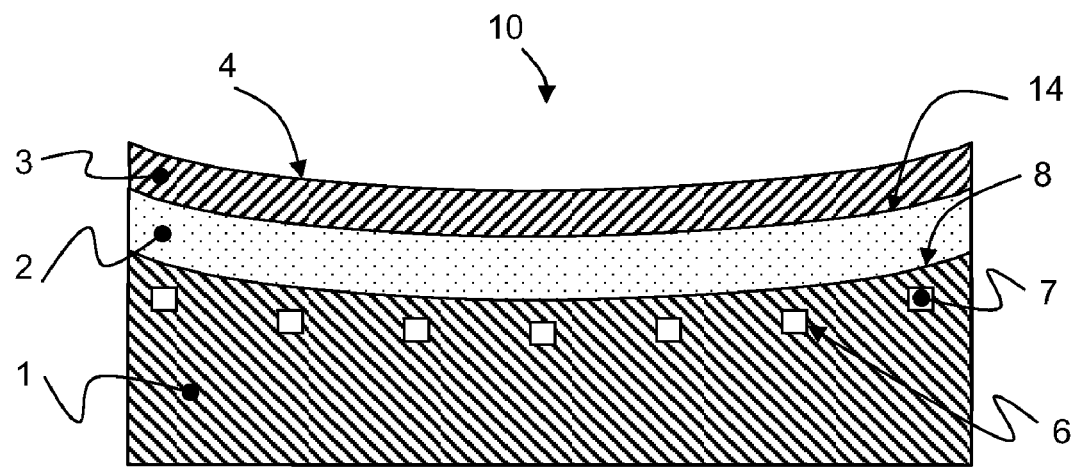
FIG. 1 shows an optical element according to the disclosure in a sectional illustration.

FIG. 1 illustrates an optical element according to the disclosure in the form of a collector mirror 10, which is provided for optical applications in an extreme ultraviolet (EUV) wavelength range of 10 nm to 15 nm, in particular of 13.5 nm. The collector mirror 10 includes a base body 1, a polishing layer 2, a reflection layer 3 and cooling channels 6.

In a first exemplary embodiment, the base body 1 is produced from a ceramic substrate, in particular from silicon carbide SiC or from silicon-infiltrated silicon carbide SiSiC. These materials are distinguished by a good thermal conductivity of 120 to 170 W/mK, a high stiffness, characterized by a modulus of elasticity of 250-350 GPa, and also a very low coefficient of thermal expansion of approximately 3 ppm/K and a low density of approximately 3 $g/cm^3$.

In a second exemplary embodiment, the base body 1 is produced from a metal composite substrate, in particular from silicon carbide dispersion strengthened aluminum AlSiC. AlSiC has a good thermal conductivity of 160 W/mK, a high stiffness, characterized by a modulus of elasticity of around 200 GPa, and also a low coefficient of thermal expansion of the order of magnitude of approximately 8 to 12 ppm/K and a low density of approximately 3 $g/cm^3$.

In a third exemplary embodiment, the base body 1 is produced from a metal substrate, which can include, in particular, aluminum or aluminum alloys such as AlSi1MgMn. These materials typically have a thermal conductivity of the order of magnitude of 130 to 220 W/mK and a modulus of elasticity of approximately 70 GPa and have a coefficient of thermal expansion of approximately 24 ppm/K and a density of approximately 2.7 $g/cm^3$. Particularly with regard to stiffness and thermal expansion, the metal substrates thus have poorer material properties than the materials from the first two exemplary embodiments. However, metal substrates afford the advantage that they are significantly less expensive in terms of production and processing.

In all three exemplary embodiments, cooling channels 6 through which a cooling medium 7 can flow are arranged in the base body 1. One advantage of the above-described materials of the base body 1 is that the cooling channels 6 can be embodied in a vacuum-tight fashion in the substrate material of the base body 1, that is to say that a loss of flow, diffusion or leakage of the cooling medium 7 through the base body 1 is at least substantially suppressed even when the collector mirror is used in an evacuated environment, which is typical of EUV applications. Coolant lines outside the optical element and connections of the coolant lines to the cooling channels 6 in the base body 1 can likewise be embodied in a vacuum-tight fashion. Connections for the coolant lines can be adhesively bonded, soldered or welded to the base body or be shaped from the substrate material of the base body 1 via suitable mechanical processing such as grinding, milling, drilling or eroding.

Figure 2A:
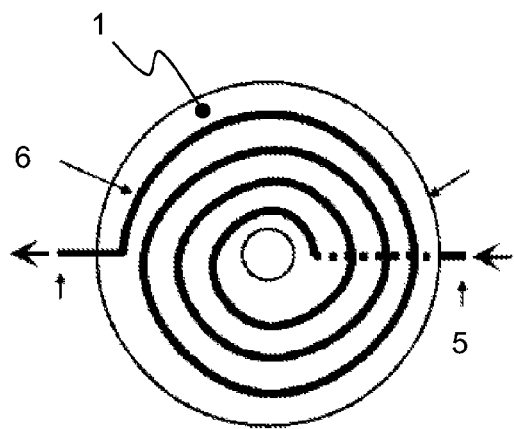
FIGS. 2a through FIG. 2d show different embodiments of the cooling channels in the base body.
Figure 2B:
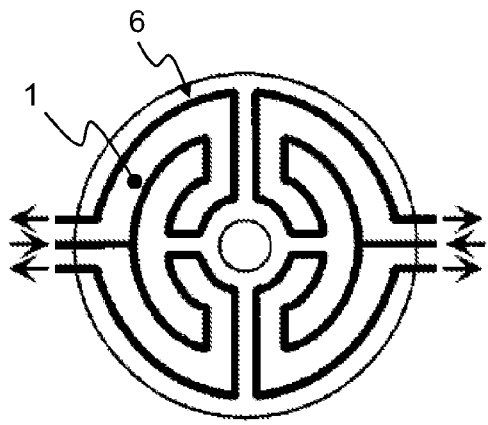
Figure 2C:
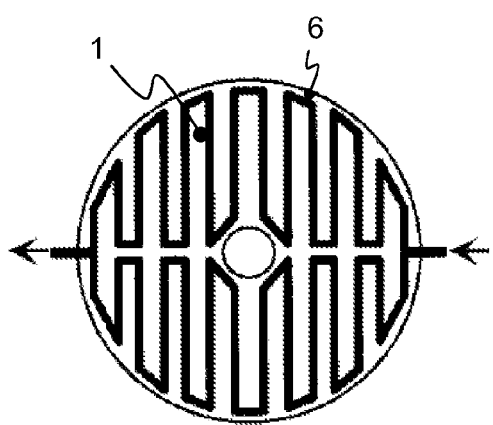
Figure 2D:
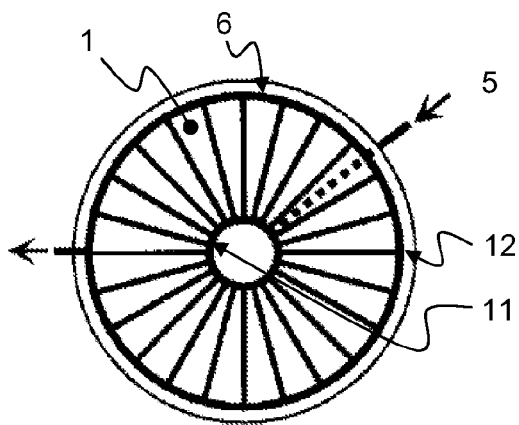

FIGS. 2a to 2d illustrate different arrangements of the cooling channels 6 in a sectional illustration through the base body 1. The distribution of the cooling channels 6 in the substrate of the base body 1 is influenced by the method of producing the base body 6, as will be explained in greater detail below. The cooling channels 6 can be arranged in the base body 1 in such a way that the influences of the residual through-embossing on the mirror surface 4 are minimized. The cooling channels 6 can be embodied for example parallel to one another (FIG. 2c), spirally (FIG. 2a), meanderingly (FIG. 2c) or radially (FIG. 2d) or in mixed forms (FIG. 2b). In the exemplary embodiments illustrated in FIGS. 2a and 2d, the cooling medium is fed via a supply line 5 from a rear side of the base body 1. The cooling channels 6, can, in principle, be supplied from a first collecting line 11 and/or lead into a second collecting line 12 (FIG. 2d). It is particularly advantageous for cold and hot cooling media to flow through adjacent cooling channels 6 in opposite directions, as illustrated for example in FIG. 2c and in FIG. 2b (only in the case of the curved cooling channels 6), since a risk of extensive distortions of the base body 1 is reduced in this way. The cooling channels 6 can be embodied with round, oval, rectangular or yet other cross-sectional forms. Furthermore, individual cooling channels 6 can be arranged at different distances from the mirror surface 4 in order, in this way, to adapt a local cooling capacity to locally different thermal loads of the mirror surface. Distortions of the mirror surface 4 can thereby be minimized further. A cross-sectional area of the cooling channels 6 is not less than 0.5 mm$^2$, such as between 40 mm$^2$ and 100 mm$^2$. In the case of these cross-sectional areas it is possible to maintain a turbulent flow in the cooling channels 6, as a result of which heat transfer from the base body 1 to the cooling medium 7 is improved.

The cooling medium 7 provided is water, which can also be used in deionized fashion or which can be admixed with additives for reducing a freezing point, for example glycol. A coolant temperature prior to being fed into the collector mirror can be between 0° C. and 30° C. in the case of water, and also less than 0° C. in the case where an agent that reduces the freezing point is added. In other exemplary embodiments, a cooling oil or a cooling gas, for example nitrogen, is used as the cooling medium.

A polishing layer 2 is applied on the base body 1, the polishing layer can include amorphous silicon, amorphous silicon monoxide SiO, amorphous silicon dioxide SiO$_2$ or a layer composed of chemically applied nickel, which can have a phosphorus content of 5 to 15%. The layer thickness is between 1 μm and 300 μm or more. Roughnesses and/or deviations of a surface 8 of the base body 1 from a desired form can be reduced or compensated for with the aid of the polishing layer 2.

A reflection layer 3 is applied on the polishing layer 2, the reflection layer being optimized for a wavelength range of the radiation for which the collector mirror 10 is provided. The reflection layer 3 can furthermore be optimized for an impingement angle of the radiation. In the case of a wavelength of 13.5 nm and an angle of incidence of the radiation of between 0° and 45°, the reflection layer 3 can be a multilayer layer composed of molybdenum and silicon or composed of ruthenium and silicon.

In the exemplary embodiments described, the reflective optical element is embodied as a collector mirror 10. Such mirrors often have the form of a truncated ellipsoid of revolution or a truncated paraboloid of revolution. Without restricting the generality, however, the disclosure can also be applied to differently curved mirrors or to mirrors having plane surfaces.

The collector mirror 10 is incorporated in a mount (not illustrated in the figures) that is optimized with regard to influencing a surface figure of the mirror and a position of the mirror in the optical system as little as possible. The mount is designed, in particular, to minimize thermal influences from the light source or from an environment of the mirror. An isostatic mount or a quasi-isostatic mount can be provided.

The reflective optical element 10 according to the disclosure is provided for use in an EUV wavelength range and exposed to a very high thermal load in the EUV spectral range in customary applications. In such a case, the thermal conductivity of conventional mirror material is too low, such that, during operation, severe heating of the mirror and subsequently bending and/or thermal degradation of the reflection layer should be expected in the case of the mirrors known from the prior art. The reflective optical element 10 according to the disclosure includes a base body 1 produced from a substrate material having a very high thermal conductivity. The high thermal conductivity of the substrate material ensures efficient heat dissipation. Cooling channels 6 are shaped in the base body 1, the cooling channels being arranged in the vicinity of a reflective surface 4 of the optical element, such that a heat transfer by heat conduction from the surface 4 through the base body 1 to a cooling medium 7 in the cooling channel 6 is made possible on a comparatively short path. A selection of a substrate material having a low coefficient of thermal expansion and a high stiffness furthermore affords the advantage that the risk of through-embossing of the structure of the cooling channels 6 as surface distortion onto the surface 6 is reduced, which would otherwise adversely affect the figure of the reflective optical element 10. By virtue of the high stiffness of the material, in particular, the cooling channels 6 can be embodied with a large cross-sectional area, without jeopardizing the stability of the base body 1. The flow in the cooling channels 6 can be turbulent, such that a good heat transfer from the base body 1 to the cooling medium 7 is possible. By virtue of the high stiffness and the low density of the substrate material, the base body 1 has a high natural frequency, such that the base body 1 is not excited, or is at most excited to small vibrations, by a comparatively low-frequency turbulent flow of the cooling medium 7 during operation.

A surface quality sufficient for use of the optical element in an EUV wavelength range can be obtained by applying a separate polishing layer with a subsequent polishing process and a reflection layer. This applies, in particular, with regard to a desired maximum deviation of the surface from a desired form and with regard to a maximum roughness.

A reflective optical element 10 according to the disclosure can be produced simply and efficiently by firstly producing a base body 1 composed of a substrate material having a high thermal conductivity, in which cooling channels 6 are formed and in the case of which a surface 8 of the base body 1 is shaped such that a desired form of the reflective surface 4 is approximated comparatively coarsely. Afterward, a polishing layer 2 composed of an amorphous material is applied to the surface 8 of the base body via a CVD process, a PE-CVD process or by sputtering and a surface 14 of the polishing layer 2 is approximated further to the desired form of the reflective surface 4 via suitable mechanical methods such as superpolishing and/or chemical methods. Via a reflection layer 3 applied afterward, the reflection properties of the optical element 10 can be improved and adapted to an envisaged field of application.

Different methods of producing the base body 1 are advantageous depending on the substrate material used.

In a base body 1 composed of ceramic substrate, the cooling channels 6 can be shaped simply and efficiently by their already being introduced in the green body of the ceramic actually prior to the ceramization process. This can be effected in the soft green body for example via mechanical material processing methods such as drilling, milling, turning, eroding, etc. or via other suitable physical or chemical processing methods. For this purpose, the green body can be produced from a plurality of parts, the cooling channels 6 being worked into one or more of the parts at the surface. Afterward, via the parts being adhesively bonded together, the base body 1 is formed and the cooling channels 6 are closed. The ceramization can be effected by silicon infiltration or by sintering, wherein the cooling channels can be protected by a graphite insert particularly during the sintering of pulverulent SiC to form the substrate body. A mirror substrate that is vacuum-tight, i.e. substantially impermeable to media, has arisen after the ceramization. In a further exemplary embodiment, the cooling channels introduced in the green body are filled by a protective compound before the parts of the base body are adhesively bonded together or joined together, the protective compound preventing an inflow and blockage of the cooling channels by silicon during the infiltration. After the ceramization step the protective compound is burned out or removed chemically by dissolution or mechanically.

In a configuration of the base body 1 composed of a metal substrate or a metal composite substrate, the base body can be assembled from two half-shells and welded, soldered or adhesively bonded at the seams. Prior to assembly, the cooling channels 6 are introduced into one or into both of the half-shells mechanically, for example by drilling, milling, turning, eroding etc. In an optional step, the cooling channel 6 is filled by a material having a higher melting point than the substrate material prior to the casting of the blank, the filling material being chemically dissolved or removed mechanically after the cooling of the casting material. In a further exemplary embodiment for producing a base body 1 composed of metal composite substrate, a tube composed of a material having a higher melting point than the substrate material is cast in during the casting of the blank. Such a tube can be produced, for example, from high-grade steel, nickel or a nickel alloy or some other material whose coefficient of thermal expansion is as close as possible to the coefficient of thermal expansion of the substrate material. The tube is bent into the desired form of the cooling channel 6 and subsequently inserted into the casting mold, the tube optionally being deformed in such a way that the tube ends project in one or more directions from the casting mold, such that a connection for a cooling medium line can subsequently be attached here. The casting mold is subsequently filled with the melt. The use of a tube ensures that the coolant channel is embodied in a vacuum-tight fashion.

What is claimed is:

1. An optical element, comprising:
   a base body comprising a substrate material having a thermal conductivity of greater than 50 W/mK; and
   a polishing layer supported by the substrate material, the polishing layer comprising an amorphous material capable of being polished,
   wherein:
      the base body has a cooling channel configured to have a cooling medium flow therethrough;
      at least one section of the cooling channel is configured so that, when the cooling medium flows therethrough, a turbulent flow of the cooling medium is produced in the at least one section; and
      the optical element is a reflective optical element configured to be used in an EUV system.

2. The optical element according to claim 1, further comprising elements arranged in the at least one section of the cooling channel to produce the turbulent flow, and/or wherein the at least one section of the cooling channel has discontinuities in the course of the cooling channel to produce the turbulent flow.

3. The optical element according to claim 1, wherein the substrate material has a modulus of elasticity of more than 60 GPa.

4. The optical element according to claim 1, wherein the substrate material has a density of at most 3.5 g/cm$^3$.

5. The optical element according to claim 1, wherein the substrate comprises a metallic material.

6. The optical element according to claim 1, wherein the substrate comprises aluminum.

7. The optical element according to claim 1, wherein the substrate comprises an aluminum alloy.

8. The optical element according to claim 1, wherein the substrate comprises a ceramic material.

9. The optical element according to claim 1, wherein the substrate comprises SiC.

10. The optical element according to claim 1, wherein the substrate comprises at least one material selected from the group consisting of Si-infiltrated silicon carbide, silicon nitrite and polysilicon.

11. The optical element according to claim 1, wherein the substrate comprises a metal composite.

12. The optical element according to claim 1, wherein the substrate comprises a silicon carbide dispersion strengthened aluminum.

13. The optical element according to claim 1, wherein the amorphous material comprises at least one material selected from the group consisting of amorphous silicon, amorphous silicon monoxide, amorphous silicon dioxide and nickel.

14. The optical element according to claim 1, further comprising a reflection layer supported by the polishing layer.

15. The optical element according to claim 14, wherein the reflection layer comprises layers of Mo/Si or layers of Ru/Si.

16. The optical element according to claim 1, wherein the cooling channel has a cross-sectional area of greater than 0.5 mm$^2$.

17. The optical element according to claim 1, wherein the cooling channel has a cross-sectional area of between 40 mm$^2$ and 100 mm$^2$.

18. The optical element according to claim 1, wherein sections of the cooling channel are arranged parallel to one another, are spiral shaped, meander, or extend radially.

19. The optical element according to claim 1, wherein the optical element is a collector mirror.

20. A method, comprising:
a) providing a base body comprising a substrate material having a thermal conductivity of greater than 50 W/mK, the base body having a cooling channel configured to have a cooling medium flow therethrough, and at least one section of the cooling channel configured so that, when the cooling medium flows therethrough, a turbulent flow of the cooling medium is produced in the at least one section;
b) shaping a surface of the base body so that a desired surface form of an optical element is approximated;
c) applying a polishing layer to the surface of the base body, the polishing layer comprising an amorphous material; and
d) processing the polishing layer to further approximate the desired surface form of the optical element.

21. The method according to claim 20, wherein, in b), the surface of the base body is shaped to a surface accuracy of at most 25 μm, and/or to a roughness of at most Ra =1 μm.

22. The method according to claim 20, further comprising applying a reflection layer to the polishing layer.

23. A system, comprising:
a reflective optical element, comprising:
a base body comprising a substrate material having a thermal conductivity of greater than 50 W/mK; and
a polishing layer supported by the substrate material, the polishing layer comprising an amorphous material capable of being polished,
wherein:
the base body has a cooling channel configured to have a cooling medium flow therethrough;
at least one section of the cooling channel is configured so that, when the cooling medium flows therethrough, a turbulent flow of the cooling medium is produced in the at least one section; and
the system is an EUV system.

24. The system of claim 23, wherein thereflective optical element is a collector mirror.

25. The system of claim 23, further comprising a mount holding, wherein the reflective optical element is incorporated in the mount.

* * * * *

UNITED STATES PATENT AND TRADEMARK OFFICE
CERTIFICATE OF CORRECTION

PATENT NO. : 8,342,701 B2
APPLICATION NO. : 12/851187
DATED : January 1, 2013
INVENTOR(S) : Holger Kierey et al.

Page 1 of 1

It is certified that error appears in the above-identified patent and that said Letters Patent is hereby corrected as shown below:

Column 10,
Line 16, delete "thereflective" and insert --the reflective--

Signed and Sealed this
Nineteenth Day of March, 2013

Teresa Stanek Rea
*Acting Director of the United States Patent and Trademark Office*